June 4, 1968 L. V. TARDOSKEGYI 3,386,166

METHOD AND APPARATUS FOR SOLDERING PRINTED CIRCUIT BOARDS

Filed April 7, 1965 3 Sheets-Sheet 1

INVENTOR.
LOUIS V. TARDOSKEGYI

BY Alfred E. Page

ATTORNEY.

June 4, 1968 L. V. TARDOSKEGYI 3,386,166

METHOD AND APPARATUS FOR SOLDERING PRINTED CIRCUIT BOARDS

Filed April 7, 1965 3 Sheets-Sheet 2

INVENTOR.
LOUIS V. TARDOSKEGYI
BY
Alfred R. Page
ATTORNEY.

METHOD AND APPARATUS FOR SOLDERING PRINTED CIRCUIT BOARDS

Filed April 7, 1965 3 Sheets-Sheet 3

INVENTOR.
LOUIS V. TARDOSKEGYI
BY Alfred E. Page
ATTORNEY.

United States Patent Office 3,386,166

Patented June 4, 1968

3,386,166

METHOD AND APPARATUS FOR SOLDERING PRINTED CIRCUIT BOARDS

Louis V. Tardoskegyi, Montreal, Quebec, Canada, assignor to Electrovert Manufacturing Co. Ltd., Montreal, Quebec, Canada Filed Apr. 7, 1965, Ser. No. 446,220
19 Claims. (Cl. 29—625)

ABSTRACT OF THE DISCLOSURE

Apparatus for fluxing and soldering printed circuit boards is disclosed as including relatively elongated guide rail means defining a path of travel for printed circuit boards through a fluxing station, a preheating station and a soldering station, with the fluxing station including means for producing a standing wave of flux and the soldering station including means for producing a standing wave of molten solder. The heating station includes a flat plate forming a source of black infrared energy and formed with slots for flow of hot air therethrough so that a combined heating by radiant energy and by convection heating is effected. This not only evaporates the solvent for the solder but also sweeps away the vapors resulting from such evaporation of the solvent. A second and subsequent heating station is provided which is again a source of infrared radiant energy but a more intense source than a first source. This heats the printed circuit boards to prevent thermal shock when the latter enter the soldering wave. A feature of the disclosure is that the relatively elongated guide rails are formed as successive individual rail sections, and individual height adjustment means are provided at the ends of the several rail sections. Thereby not only the height of the rails at the fluxing and soldering stations but also the angle of inclination of the rails at these stations can be adjusted, to adjust the depth of immersion of the printed circuit boards in the flux wave and in the solder wave, and to adjust the angle of entry and the angle of exit of printed circuit boards relattve to these two waves.

*Background of the invention*

This invention relates to the fluxing and soldering of printed circuit boards and, more particularly, to a novel method and apparatus for this purpose, by means of which the quality of the soldered joints is very greatly improved and by means of which a more flexible control of the several steps of the continuous fluxing, preheating and soldering operations can be obtained with increased efficiency and ease of control and operation.

It is a known fact that any surface, no matter how chemically and physically clean it is initially, will receive at least a slight oxide layer or film thereon when exposed to atmospheric conditions. This is particularly true of such metal surfaces as, for example, copper, which will oxidize instantly when exposed to air. Accordingly, when it is desired to apply solder to a metal surface or component lead, it is necessary, in order to obtain a good bond between the solder and the metal surfaces to be jointed, thoroughly to clean the surface of the material to be soldered before applying the solder thereto. This is particularly true in the case of printed circuit boards wherein exposed conductor strips and exposed component leads pick up at least a silght oxide layer between the time the boards are printed and the time they are soldered.

For this purpose, fluxes are used to clean the metal surfaces in advance of the application of solder thereto. These fluxes are of two types. One type is a rosin base flux which is dissolved e.g. in alcohol as a vehicle. Another type of flux containing salts or organic acids, and fluxes of this type are dissolved in water. In both cases, the solvent is only a vehicle for carrying the flux to the surface to be cleaned. The solvents for both fluxes are volatile and thus, under the heat of the soldering operation, will form vapors and steam. This is undesirable because its forms occlusions of vapor in the deposited solder during the soldering operation.

For this reason, in arrangements for fluxing and soldering printed circuit boards, and involving a fluxing station and a soldering station, a preheating station is included between the fluxing station and the soldering station. The preheating operation, taking place at the preheating station, has several purposes. In the first place, it is desired to evaporate the carrying vehicle for the solder. In the second place, it is desirable to preheat the printed circuit board and thus eliminate thermal shock as well as provide a higher heat content of the boards, in terms of B.t.u.'s, as the board reaches the soldering position. Due to the resulting higher heat content of the printed circuit board during the soldering operation, chilling of the board will be retarded resulting in the tendency to reduce the icicles or solder drippings on the soldered printed circuit board. A third purpose of the preheating operation is to initiate the activity of the rosin base fluxes. Thus, rosin base fluxes are mild and slow acting fluxes, which are substantially inert at room temperature, but rosin will liquefy and develop an acid reaction at temperatures above 200° F. and, upon cooling, will leave a non-hydroscopic residue. This effect of preheating is not so important in the case of organic acid or salt fluxes, which are active at room temperature.

In a continuous production operation, it is desirable that the preheating step be carried out in a single pass. Accordingly, various arrangements have been proposed for providing a high intensity heat source over which the printed circuit boards will travel in their passage from the fluxing station to the soldering station. For this purpose, arrangements involving the use of infra-red energy have been proposed and used. However, practical experience has indicated that the effectiveness of evaporation of solvent, and of preheating of the printed circuit board to avoid thermal shock, is not consistent with the amount of energy input to the printed circuit board as it passes the preheating station. For example, even with a high intensity infra-red heating arrangement at the preheating station, it has been found that some of the solvent remains on the board as it reaches the soldering station and consequently will cause the aforementioned occlusion of vapor pockets and the like in the deposited solder.

The instantaneous application of the highest intensity radiant heat, as characteristic of conventional type heating banks, can cause such agitation in the bulk of the layer of solvent, elevated to boiling temperature, that bubbling of the evaporated liquid may burst or rip solid flux particles away, thus decreasing the flux on the board. If the flux is heated progressively, however, and is evaporated layer by layer, this will not occur.

In an attempt to improve the obtained results, experiments have been made in which the printed circuit board has been passed several times at high speed through the preheating station with the number of passes being, for example, one less than the pass speed in feet per minute. This has produced good results insofar as preheating of the circuit board and evaporation of the solder solvent are concerned. Good results have also been attained by passing the printed circuit board at a relatively very low speed past the preheating station. However, it will be apparent that passing the printed circuit board through the preheating station several times, or passing it at a relatively low speed, will greatly interfere with the production capacity of the fluxing and soldering apparatus. When the board has been passed several times past the preheating station, the temperature at the preheating station has been reduced substantially below the temperature used when the board is given a single pass through the preheating station. Further experiments have been made in which the board has been initially subjected to intense heat and then to less intense heat, and vice versa, this being tried with the board being passed through the heating station at relatively low speeds.

Accordingly, an object of the present invention is to provide a method of preheating a printed circuit board, between a fluxing operation and a soldering operation, and by which the flux solvent is effectively removed and the printed circuit board is effectively preheated.

Another object of the invention is to provide a soldering apparatus including a fluxing station, a soldering station, and a preheating station intermediate the fluxing and soldering stations and involving a preheating arrangement by means of which the flux solvent for the solder is effectively evaporated in advance of the soldering operation, and the printed circuit board is given an effective heat content in advance of the soldering station.

The elimination of the flux solvent proceeds progressively by slow evaporation of the solvent without intense vapor bubble formation, which latter might remove and rip solid flux particles from the flux layer when separated from this layer by radiant heating causing intensive boiling. This progressive boiling avoids the suspended solid flux particles, or other fluxing substance, being also removed from the board along with evaporating liquid, and causing a decrease in fluxing activity or even causing void spots on the board surface.

A further object of the invention is to provide a method and apparatus for preheating a printed circuit board between a fluxing operation and a soldering operation in which the board is heated sufficiently to evaporate the solvent for the flux and to impart a desirably high heat content to the printed circuit board, in advance of the soldering operation, and in which this is effected in a continuous operation with a single pass of the printed circuit board through the preheating station.

In accordance with the present invention, such effective preheating is provided by using a combination of radiant heating and convection heating. Thus, in the first stage of preheating of the printed circuit board and the covering flux layer, the preheating is effected by black infra-red radiation which can be controlled in intensity and thus can be adapted to the required evaporation temperature of the flux solvent. This has the primary purpose of supplying the heat required for evaporation of the flux solvent. At this stage, the preheating is reinforced and supported by an additional convection heating which is effected by a slow and steady flow of hot dry air. This latter serves several purposes. After this first stage, during which the flux solvent has been substantially or completely removed, the second stage of preheating takes place. During this second stage, an intensive medium range infra-red radiant heating is applied. The wave length of this second stage infra-red radiant heating is so selected as to provide for a speedy and effective absorption of heat by both the flux and the printed circuit board, thus preheating also the conductor surfaces. This results in a much more effective pre-conditioning of the fluxed printed circuit board for the soldering operation.

While various theories may be advanced as to why previous one-pass arrangements for preheating printed circuit boards have been less efficient, several considerations may be mentioned. In the first place, irrespective of the temperature used at the preheating station, the effective temperature at the surface of the board will not exceed the boiling temperature of the solvent. Additionally, the boiling liquid interface, the gases and vapors leaving the bulk of the liquid flux layer, and the always present moisture and $CO_2$ in the air work in opposition to the radiant heating. In the invention method, where convection heating is used in combination with radiant heating, the vapors which rise and form bubbles are carried away by the convection heating current, freeing the way for additional radiant heating. Thus, the barrier to radiant heating is removed, in addition to which the hot, dry air easily picks up moisture, and removes it from the surface of the board, thus accelerating the rate of evaporation of the flux solvent.

While proper preheating of a printed circuit board between the fluxing operation and the soldering operation is of the greatest importance in obtaining a completely satisfactory end product, nevertheless there are other factors which do enter into the production of a properly soldered printed circuit board. These other factors are of particular importance in the so-called "wave" fluxing and soldering wherein the printed circuit board is passed over a standing wave of flux and, after preheating, is passed over a standing wave of molten solder. It should be noted, at this point, that the term "wave" as used herein and hereinafter relates to a standing wave which may be either a non-aerated liquid or may be an aerated or foaming liquid. For example, the angle of attack and the angle of withdrawal of the printed circuit board with respect to a fluxing wave and to a solder wave is of great importance in obtaining a proper finished product.

Proper deposition of flux and proper soldering is, amongst others, a function of the dwell time of the board in the fluxing wave and in the soldering wave, just as well as a function of the entry and exit angles of the board with respect to the wave, and is further a function of the depth of immersion of the board in the fluxing wave and in the solder wave. This is due to the fact that a good soldered joint requires a thoroughly even and continuous layer of flux on the surfaces to be soldered. Applying the flux and applying the solder by passing the printed circuit board through a standing wave of flux and a standing wave of solder is of particular importance, particularly with respect to the flux wave. Due to the fact that the flux wave is in motion, there is a washing action which greatly expedites the removal of the air film from the surface to be fluxed and soldered. Every surface has such an air film which will adhere to the surface by absorption, whether it is a surface of a metal body or a surface of a non-metallic body. Thus, as the printed circuit board is moved toward a flux wave or toward a solder bath, a layer of air is trapped therebeneath, and this layer of air, or air film, can seriously interfere with proper fluxing and soldering on the printed circuit board. The washing action of the flux or solder wave will remove such absorbed layers, and thus wave type fluxing and soldering are superior to other methods of flux and solder application.

Generally speaking, in a soldering apparatus involving a fluxing operation, a preheating operation and a soldering operation, particularly for printed circuit boards, the boards are disposed upon carriers which move the boards successively through the several stations. These carriers are arranged to move along rails or tracks which extend the full length of the soldering machine and may be driven, for example, by chain drive means having pusher elements or the like on the chain or chains.

There are many advantages to being able to select the angle at which the printed soldering board enters and leaves either the flux wave or the soldering wave. Thus, when a printed circuit board passes through a flux wave in a horizontal position, the trailing edge of the board tends to pick up flux. This not only results in a waste of flux, but furthermore requires additional heat for removal of the excess flux which is picked up on the trailing edge of the board. Similarly, when a printed circuit board passes through a soldering wave in a horizontal position, there is a tendency to the formation of icicles, particularly due to the variable "peel off" of the soldering wave. While the most favorable entry and exit angles of the printed circuit board into the solder wave may be equal to the most favorable entry and exit angles of the board with respect to the fluxing wave, this is generally not the case, and the respective angles may differ substantially from each other.

With present known arrangements for transporting printed circuit boards past a fluxing station, a preheating station and a soldering station, adjustment of the entry or exit angle of the printed circuit board with respect to the soldering wave will effect the entry and exit angles of the printed circuit board with respect to the fluxing wave and vice versa. This is due to the fact that a single relatively elongated and relatively rigid set of tracks is provided for transportation of the printed circuit board past the several stations. This becomes particularly disadvantageous with increasing lengths of soldering machines, such as soldering machines having an over-all length of 16 feet, 20 feet and 24 feet. It will be apparent that adjustment of the elevation of one end of the guide rails for the carriers for the printed circuit boards, to change the entry angle or the exit angle of the printed circuit boards with respect either to the fluxing wave or to the soldering wave will correspondingly change the entry and exit angles with respect to the other wave. Consequently, with present arrangements, it is not possible to individually and independently adjust the entry and exit angles of the printed circuit board with respect to a flux wave and the entry and exit angles of a printed circuit board with respect to the soldering wave.

Accordingly, a further object of the invention is to provide a method of fluxing, preheating and soldering printed circuit boards in which the entry and exit angles of the printed circuit boards with respect to the fluxing wave may be adjusted independently of the entry and exit angles of the printed circuit boards with respect to the soldering wave, and vice versa.

Yet another object of the invention is to provide an apparatus for transporting printed circuit boards past a fluxing wave, through a preheating station, and past a soldering wave, and including means whereby the entry and exit angles of the printed circuit board with respect to the fluxing wave, and with respect to the soldering wave, may be adjusted independently of each other.

Still another object of the invention is to provide such a method and apparatus in which the path of the printed circuit boards through the preheating station may be independently adjusted.

Another object of the invention is to provide such an apparatus in which adjustment of the angles is effected in a simple and easy manner by using a minimum number of controls which are readily accessible to an operator.

Still another object of the invention is to provide a method and apparatus of the type mentioned above in which the depth of immersion of the printed circuit board in the fluxing wave may be adjusted independently of the depth of immersion of the printed circuit board in the soldering wave, and vice versa.

A still further object of the invention is to provide a method and apparatus for the most accurate fine adjustment of the angles of entry and exit and the immersion depth at the fluxing and soldering positions, and fully independent of conditions prevailing in other sections of the operation.

To attain the foregoing objects, the apparatus of the invention has a guiding track for the printed circuit board carrier which is divided into three independently adjustable sections, one extending through the fluxing station, the second extending through the preheating station and the third extending through the soldering station. Individually adjustable height adjustment means are provided at each end of each section, with the adjustment means at the adjacent ends of the first and second sections and of the second and third sections being common to both the adjacent sections. Thereby, it is possible to adjust independently not only the depth of immersion of the printed circuit board but also the angle of entry and the angle of exit of the printed circuit board with respect to the fluxing wave and the soldering wave. The fact that this is important will be appreciated when it is realized that there are two types of waves used in wave soldering, one of which may be termed a double-sided wave and the other of which may be termed a single-sided wave. Also, and as previously mentioned, two types of wave compositions are used, particularly for fluxing, one being a foam wave which is a wave of aerated flux mixed in a vehicle and the other being a continuous or non-aerated liquid wave.

For an understanding of the principles of the invention, reference is made to the following description of typical embodiments thereof as illustrated in the accompanying drawings.

Figure 1:
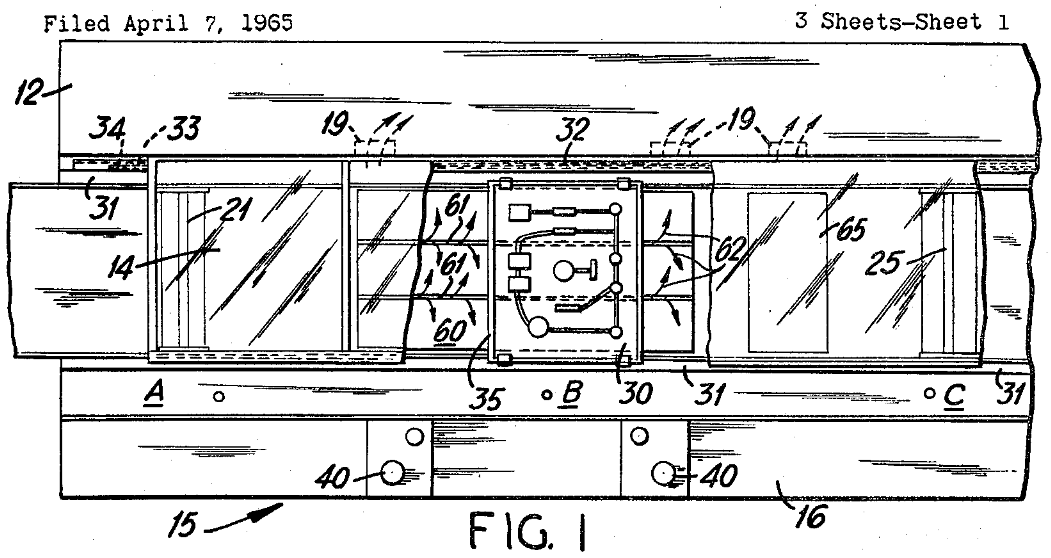
FIG. 1 is a partial plan view of one form of apparatus embodying the invention.

Referring to the drawings, a relatively elongated production fluxing and soldering apparatus 15, for the treatment or processing of printed circuit boards, is indicated as including an elongated casing 16. Casing 16 contains known flux circulating apparatus, indicated at 17, for providing a standing flux wave 20, and known solder heating and circulating means 18 for providing a standing solder wave 25. Thus, the means for providing the standing flux wave 20 comprises a relatively narrow and elongated nozzle 21 extending laterally of the path of travel of a printed circuit board 30, and the solder heating and circulating means include a relatively narrow and elongated upwardly directed nozzle 26 likewise extending transversely of the path of travel of printed circuit board 30. Casing 16 further includes air heating and circulating means, in accordance with the invention, and various controls.

Figure 2:
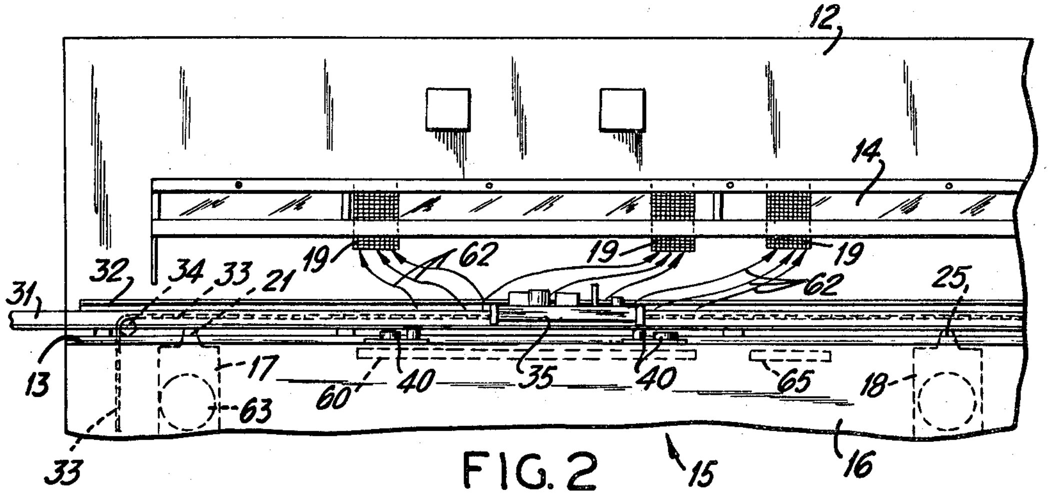
FIG. 2 is a partial front elevation view of the apparatus shown in FIG. 1.
Figure 3:
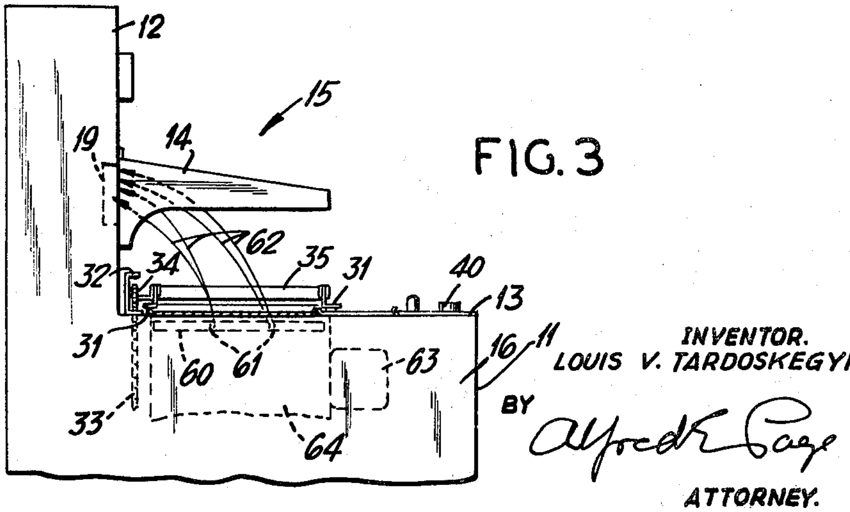
FIG. 3 is a left end elevation view of the apparatus shown in FIGS. 1 and 2.
Figure 4:
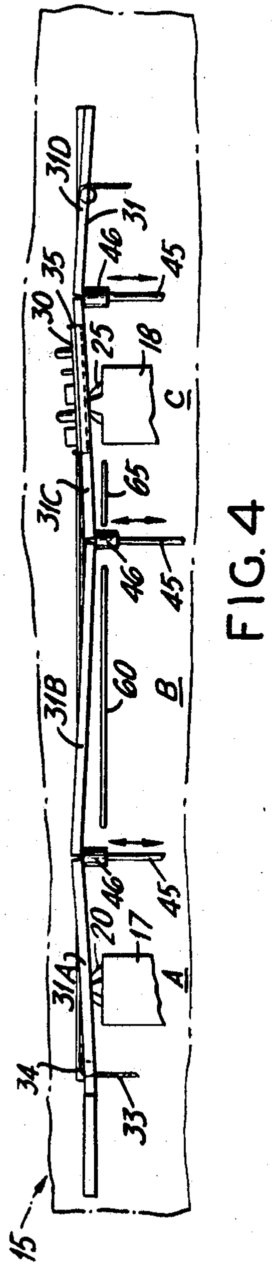
FIG. 4 is a part elevation view and part diagrammatic view of the adjustment of track sections to adjust the several entry and exit angles.
Figure 5:
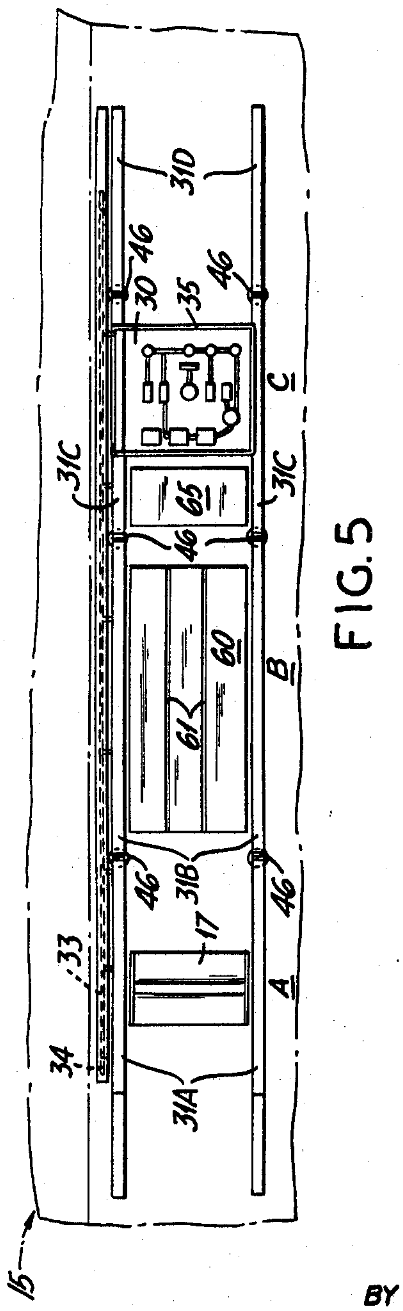
FIG. 5 is a plan view corresponding to FIG. 4.

Considered from left to right, as viewed in FIGS. 1 and 2, casing 15 is divided into three sections of which the first section A is a fluxing section, the second or intermediate section B is a preheating section, and the third section C is a soldering section. Casing 16 has a front control panel 11 where all control knobs and switches, together with the electric signal and indicator lamps, are placed. The casing also has a back panel indicator panel 12 extending above its upper surface 13 and, supported upon panel 12, is an awning or hood 14 of transparent material. Transparent awning or hood 14 permits an operator to observe the various operations while preventing fumes and the like from the operations from rising and interfering with the operator. Exhaust means, such as vents 19, are provided in back panel 12 beneath hood 14 to draw off the fumes and the like.

The means for guiding and supporting printed circuit board 30 during its passage through the apparatus comprises a pair of track rails 31 positioned at a short distance above the upper surface 14 of casing or cabinet 16. Rails 31 may have a suitable cross section, such as channel or angle cross section, and extend in spaced parallel relation with each other through the full length of the casing. Immediately adjacent the rear rail 31 there is a forwardly opening channel 32 which serves as a guiding enclosure for an endless chain 33 trained over sprockets 34 at each end of casing 15. At uniformly spaced intervals along its length, chain 33 has mounted thereon pusher elements or the like 36 which are engageable with circuit board carriers 35 arranged to slide along rails 31. While only a single chain has been illustrated in the drawing, a pair of chains may be used with the second chain extending through a channel guide adjacent the front rail 31. In such case, the two chains are operated in synchronism with each other and the pusher means are arranged in pairs and are aligned transversely of casing 16 and rails 31.

Although not illustrated in the drawing, a second chain conveyor type transfer mechanism is mounted on the top surface of casing 15 for the purpose of returning carriers 35, with the soldered circuit boards 30, to the loading end of the unit. This transfer mechanism has not been illustrated as it does not form part of the present invention.

For a purpose to be described, rails 31 are divided into three sections 31A, 31B and 31C. Sections 31A extend through fluxing station A, sections 31B extend through preheating station B, and sections 31C extend through soldering station C. Height adjustment means are provided at the leading ends of the first sections, at the junctions of the first and second sections, at the junctions of the second and third stations, and at the trailing ends of the third sections. These height adjustment means may be operated by micrometer type control knobs 40 which are disposed forwardly of the front rail 31, adjacent each of the mentioned adjustment means.

Figure 8:
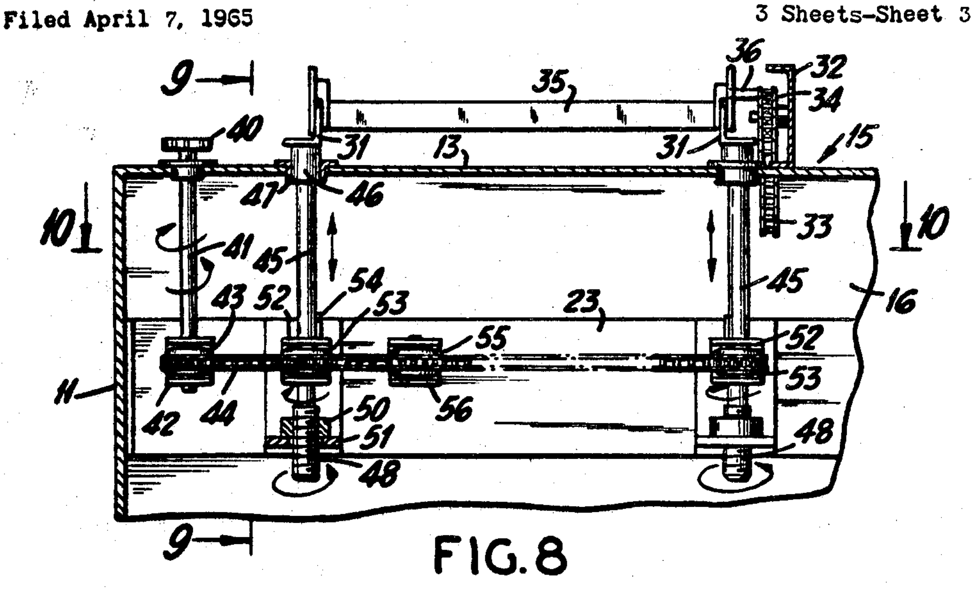
FIG. 8 is a partial transverse sectional view of the apparatus shown in FIGS. 1 and 2 and illustrating the means for adjusting the entry and exit angles and the height of the printed circuit board with respect to the fluxing and soldering waves.
Figure 9:
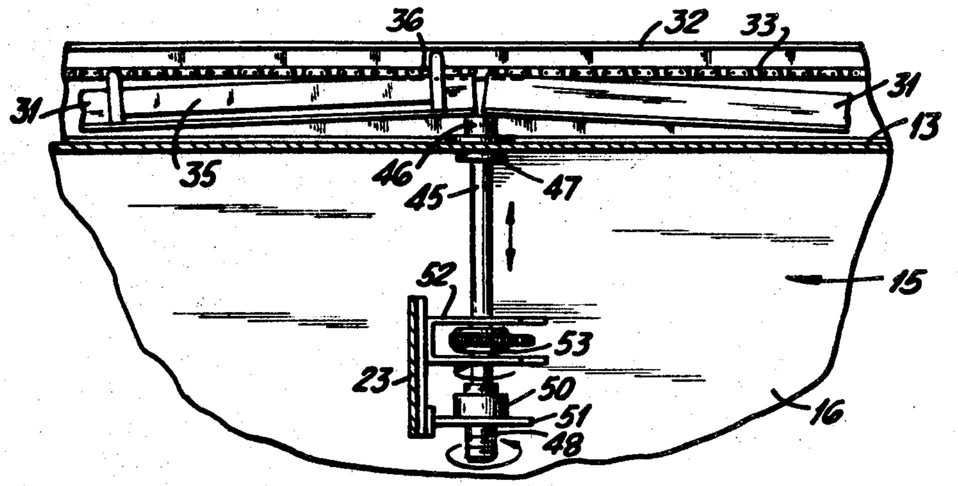
FIGS. 9 and 10 are sectional views taken on the correspondingly numbered lines of FIG. 8.
Figure 10:
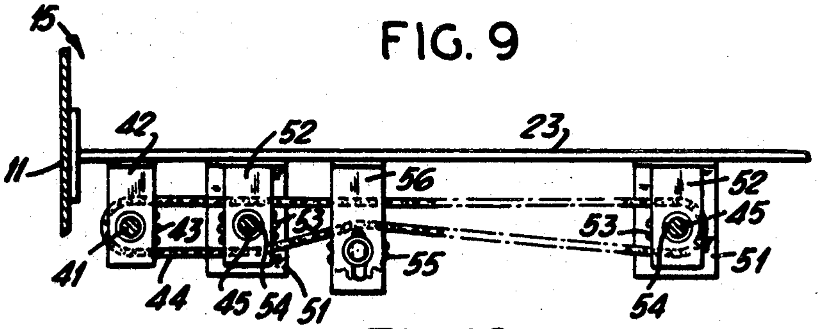

The height adjustment may be effected in any suitable manner and, as indicated in FIGS. 8, 9 and 10, it may be effected by a worm and form wheel drive arrangement controlled by adjustment knobs 40. Each knob 40 is secured to the upper end of a shaft 41 rotatably mounted through the upper surface 13 of casing 16 and through a U-shaped bracket 42 secured to a transverse member 23 of casing 16. A sprocket 43 is fixed to each shaft 41 between the arms of the associated bracket 42, so that bracket 42 prevents axial displacement of sprocket 43. For a purpose to be described, each bracket 43 has an endless chain 44 trained therearound.

The free ends of the leading and trailing track sections, and the junctions of succeeding track sections with each other, are supported upon vertically adjustable posts or shafts 45. Each shaft 45 has a bearing portion 46 on its upper end axially movable through a bearing collar 47 mounted on the upper surface of member 13 of frame 16. The lower end of each shaft 45 is formed with a threaded portion 48 threadedly engaged in a stationary nut 50 secured to a bracket 51 mounted on transverse frame portion 23. Just above the threaded portion 58, each shaft 45 extends through apertures in a U-shaped bracket 52 mounted on transverse member 23. A sprocket 53 is mounted on each shaft 45 between the upper and lower arms of bracket 52, and is secured to rotate with the associated shaft 45 by means of a key 54, while being displaceable axially relative to the associated shaft 45.

Thus, each shaft 45 may move axially relative to its associated sprocket 53 while being constrained to rotate therewith. Each sprocket 53 is engaged with both runs of chain 44 so that the shafts 45 are constrained to rotate in synchronism with the rotation or angular adjustment of shaft 41, as effected by knob 40. An idler sprocket 55 is engaged with each chain 44 intermediate the two shafts 45 operated thereby, and idler sprocket 55 is adjustably mounted in a bracket 56 secured to member 53 as best illustrated in FIG. 10.

It will be appreciated that the arrangement thus described provides for conjoint adjustment for the supports for the track on both sides by operation of the associated control knob 40. The degree of adjustment need be relatively small as only small adjustment is necessary to cover the ranges of entry and exit angles and the depths of immersion, as the soldering wave and flux wave devices of the apparatus are designed for limited independent adjustment of the height of the soldering and flux waves. Solely by way of example and by no means by way of limitation, the range of adjustment of the ends and junctions of the rail sections may be of the order of $\pm 2\frac{1}{2}''$. It should be emphasized that the adjustment mechanism is effective to adjust both the angle and the height of the tracks, and the mechanism naturally provides also for raising and lowering the tracks while the latter are maintained in a horizontal plane.

The fluxing station A has the relatively narrow elongated nozzle 21 extending transversely thereacross, and flux suspended in a suitable vehicle, such as one of the vehicles previously mentioned, is continuously pumped upwardly through nozzle 21 and flows over the side thereof to form a standing flux wave 20 of the two-sided type. Similarly, the soldering station B includes the relatively elongated and narrow nozzle 26 extending transversely thereacross, and molten solder is continuously forced upwardly through nozzle 26 and overflows the side exit thereof to form a standing soldering wave 25, which is a two-sided wave. Alternatively, either the fluxing wave or the soldering wave could be of the one-sided wave type. The solder wave can also be of such character that oil is applied to the wave surface, either by forced injection in the oil flow or by application of an oil film to the wave surface.

In accordance with the invention, the preheating station is divided into a first and second stage. The first stage includes a relatively elongated and relatively flat hot plate 60 which is arranged to provide a black infra-red radiation source. A pair of relatively elongated nozzles or slots 61 extend longitudinally of black radiation plate 60, and are in laterally spaced relation throughout the length thereof. Suitable means, such as a blower 63 delivering air to a heated plenum chamber 64, are provided for directing hot, dry air through nozzles or slots 61, and the air is exhausted through vents 19, as indicated by arrows 62. To the right of black infra-red radiation plate 60, having nozzles or slots 61 extending longitudinally thereof, there is a second and considerably smaller infra-red radiation plate 65 which emits very intensive, medium range, infra-red radiation, and which is not provided with air nozzles.

In the operation of the apparatus as thus far described, printed circuit boards 30 are carried lengthwise of the apparatus by carriers 35 which are in the form of open, substantially rectangular frames, having means thereon for adjustably positioning and holding printed circuit boards in operative relation to the fluxing and soldering waves. Carriers 35 move along the aforementioned guide rails 31. Each carrier 35, having a printed circuit board 30 mounted thereon, is positioned on rails 31 at the left end thereof and the carrier is engaged by the abutments 36 on the endless chain or chains 33 to move the carrier toward the fluxing wave 20. As the board 30 passes through the fluxing wave, liquid flux is deposited over the under surfaces thereof. The board then passes into the preheating zone B.

In passing over black infra-red radiation plate 60 provided with air slots 61, board 30 is subjected to preheating by black infra-red radiation, which is partially absorbed while, at the same time, being heated by convection heating with dry, hot air supplied through nozzles 61. The vapors rising from the flux solvent form bubbles which are carried away by the convection air current. This frees a way for additional radiant heating. These vapors rise from the flux as the latter reaches the boiling temperature of the solvent. The convection current thus removes the radiation barrier, and furthermore the dry air easily picks up moisture or solvent.

During the first stage of the preheating, the flux solvent is substantially all removed. The printed circuit board 30 then passes through the second stage of preheating wherein it is subjected solely to radiant infra-red heat from the smaller plate 65, and without convection heating. In other words, in the second stage, the printed circuit board 30 is heated solely by intensive, medium range infra-red radiation. The radiant heat is absorbed by the flux itself, by the board and by the metal on the board. This assures better and more proper fluxing of the board. At the same time, the printed circuit board itself is preheated so that it has a substantial heat content when it enters the soldering zone C, thereby avoiding thermal shock. The flux is also preheated, which is a great advantage in the case of a rosin base flux.

The board 30, leaving the second stage of preheating zone B, enters soldering zone C and passes through soldering wave 25, where soldering is performed. Due to the substantially complete removal of the flux solvent in the first preheating stage, followed by the high heating in the second preheating stage, there are no solvent bubbles or vapor bubbles formed on board 30 while the soldering is performed, thereby avoiding occlusion of vapor or gas bubbles in the deposited solder. Thus, excellent conditions are established for the formation of reject-free sound solder joints, with the solder also penetrating fully through all holes and eyelets whereby a solid and continuous layer of solder is applied on all metal conductor surfaces of board 30.

In a typical example, the black infra-red radiation plate 60 may have a temperature of up to 600° F. which may be effected by a three-stage control providing 100% of design temperature, 50% of design temperature, and 25% of design temperature. The hot, dry air is applied at a constant rate, and at a temperature of 400° F. In the second stage, the infra-red radiation plate 65 may have a temperature of 1200° F. and there is no convection heating of the printed circuit board 30.

Figure 7:
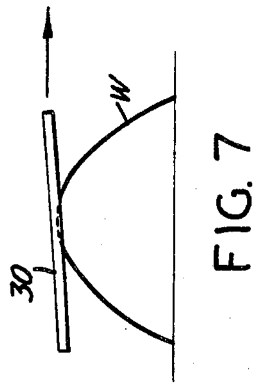
FIGS. 6 and 7 are somewhat schematic side elevation views illustrating the passage of a printed circuit board through a fluxing or soldering wave.
Figure 6:
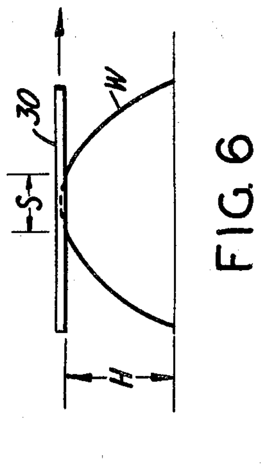

FIGS. 6 and 7 illustrate graphically the conditions prevailing when a printed circuit board 30 passes through a fluxing or soldering wave W. Referring to FIG. 6, if the rate of travel of board 30 is constant, the dwell time in the wave W is proportional to the distance S. It will be apparent that this distance S is, with a constant height wave W, a function of the relative height H of board 30 in passing through the wave. FIG. 7 illustrates the conditions when the board 30 passes through the wave W at an angle to the horizontal, either at an exit or an entry angle, with only the entry angle being shown.

As stated, the individual rail sections are adjustable at each end as to height. Thus, by conjoint use of the adjustment means at each end of the first rail section 31A, the entry angle or the exit angle of printed circuit board 30 relative to flux wave 20 may be selected without any effect upon the corresponding angles with respect to soldering wave 25. Similarly, by conjoint adjustment of the height adjustment controls at each end of the third rail sections 31C, the entry and exit angles of printed circuit board 30 with respect to solder wave 25 may be adjusted without any effect on the corresponding angles with respect to flux wave 20. Of course, this will have some effect upon the angle, with respect to the horizontal, at which printed circuit board 30 travels through preheating zone B, but this latter is of minimal effect.

Furthermore, such conjoint adjustment at both ends of the first and third rail sections, 31A and 31C, respectively, can be used to preset the depth of immersion of printed circuit board 30 in either the flux wave 20 or soldering wave 25 without effecting the depth of immersion in the other of these two waves. The adjustment of the travel plane of printed circuit board 30 with respect to either flux wave 20 or soldering wave 25 may be set horizontal, at a slightly ascending angle, or at a slightly descending angle. For example, in fluxing station A, board 30 may be made to have an ascending angle, may be made to travel horizontally through preheating stage B, and made to have an ascending angle in soldering stage C. Similarly, the board may be made to have an ascending angle in the fluxing stage, a horizontal angle in the preheating stage, and to pass horizontally through the soldering stage.

The control of the angle and of the immersion depth will also serve to influence the washing action of the flux wave 20, just as well as it will serve to influence the flux penetration into eyelets, "through" holes, and the like. Also, the area of contact between the board and the fluxing or soldering wave varies with the angle of entry or the angle of exit. This is particularly true in the case of the foam-type flux wave, in which the angle will determine the contact area as the foam flux wave is relatively wide and, in foam fluxing, immersion depth will also control the intensity of contact between the flux foam and the printed circuit board. Drainage conditions are better with an ascending angle.

Basically, the advantages of control of the angles of entry and exit, and of control of immersion depth, as referred to in connection with the fluxing operation, are equally pertinent to the soldering operation. The angle of exit is of particular importance in double-sided wave type soldering operations, as it provides for a progressive and gradual exit of the printed circuit board from the soldering wave and from the radiating heat zone of the soldering wave. This, together with the improved drainage conditions prevailing on a slanted surface, will efficiently drain excess solder from the board, thus producing a soldered board free of icicles and solder build-ups.

For a one-sided soldering wave type of operation, a horizontal travel orientation may be more advantageous, and this possibility is again provided by the adjustability of the rails 31.

Improved flexibility is provided as the operator can observe the waves while setting the controls to adjust the entry and exit angles. Thus the apparatus has controlability, precision, accuracy and reliability due to the individual adjustments possible with the several track sections. It furthermore may be used with any type of wave, either a double-sided wave, a single-sided wave or either of these waves containing oil.

While specific embodiments of the invention have been shown and described in detail to illustrate the application of the principles of the invention, it will be understood that the invention may be embodied otherwise without departing from such principles.

What is claimed is:

1. A method of fluxing and soldering a printed circuit board comprising the steps of fluxing the printed circuit board with a flux dissolved in a solvent; then simultaneously subjecting the fluxed printed circuit board to radiant heating and convection heating by a forced flow of heated gaseous medium, to evaporate the solvent and sweep the vapors from the printed circuit board; and thereafter applying molten solder to the fluxed surfaces of the printed circuit board.

2. A method of fluxing and soldering a printed circuit board comprising the steps of fluxing the printed circuit board with a flux dissloved in a solvent; then simultaneously subjecting the fluxed printed circuit board to infra-red radiant heating and convection heating by a forced flow of heated gaseous medium, to evaporate the solvent and sweep the vapors from the printed circuit board; and thereafter applying molten solder to the fluxed surfaces of the printed circuit board.

3. A method of fluxing and soldering a printed circuit board comprising the steps of fluxing the printed circuit board with a flux dissolved in a solvent; then simultaneously subjecting the fluxed printed circuit board to black infra-red radiant heating and convection heating by a forced flow of heated gaseous medium, to evaporate the solvent and sweep the vapors from the printed circuit board; and thereafter applying molten solder to the fluxed surfaces of the printed circuit board.

4. A method of fluxing and soldering a printed circuit board comprising the steps of fluxing the printed circuit board with a flux dissolved in a solvent; then simultaneously subjecting the fluxed printed circuit board to radiant heating and convection heating by forced flow of heated gaseous medium, to evaporate the solvent and sweep the vapors from the printed board; then subjecting the fluxed printed circuit board solely to a source of more intense radiant heat to complete the evaporation of the solvent and to preheat the fluxed surfaces of the printed circuit board; and thereafter applying molten solder to the preheated fluxed surfaces of the printed circuit board.

5. A method of fluxing and soldering a printed circuit board comprising the steps of fluxing the printed circuit board with a flux dissolved in a solvent; simultaneously subjecting the fluxed printed circuit board to black infra-red radiant heating and convection heating by forced flow of heated gaseous medium, to evaporate the solvent and sweep the vapors from the printed circuit board; then subjecting the fluxed printed circuit board solely to a source of intense infra-red radiant heat to complete evaporation of the solvent and to preheat the fluxed surfaces of the printed circuit board; and thereafter applying molten solder to the preheated fluxed surfaces of the printed circuit board.

6. A method of progressively fluxing and soldering a printed circuit board comprising the steps of moving the printed circuit board along a path including, in succession, a fluxing station, a heating station and a soldering station; in the fluxing station, passing the printed circuit board through a wave of flux dissolved in a solvent; in the heating station, simultaneously subjecting the fluxed printed circuit board to radiant heating and convection heating by a forced flow of heated gaseous medium, to evaporate the solvent and sweep the vapors from the printed circuit board; and, in the soldering station, passing the printed circuit board through a wave of molten solder to apply molten solder to the fluxed heated surfaces of the printed circuit board.

7. A method of progressively fluxing and soldering a printed circuit board comprising the steps of moving the printed circuit board along a path including, in succession, a fluxing station, a heating station and a soldering station; in the fluxing station, passing the printed circuit board through a wave of flux dissolved in a solvent; in the heating station, simultaneously subjecting the fluxed printed circuit board to infra-red radiant heating and convection heating by a forced flow of heated gaseous medium, to evaporate the solvent and sweep the vapors from the printed circuit board; and, in the soldering station, passing the printed circuit board through a wave of molten solder to apply molten solder to the fluxed heated surfaces of the printed circuit board.

8. A method of progressively fluxing and soldering a printed circuit board comprising the steps of moving the printed circuit board along a path including, in succession, a fluxing station, a heating station and a soldering station; in the fluxing station, passing the printed circuit board through a wave of flux dissolved in a solvent; in the heating station, simultaneously subjecting the fluxed printed circuit board to black infra-red radiant heating and convection heating by a forced flow of heated gaseous medium, to evaporate the solvent and sweep the vapors from the printed circuit board; and, in the soldering station, passing the printed circuit board through a wave of molten solder to apply molten solder to the fluxed heated surfaces of the printed circuit board.

9. A method of progressively fluxing and soldering a printed circuit board comprising the steps of moving the printed circuit board along a path including, in succession, a fluxing station, a heating station and a soldering station; in the fluxing station, passing the printed circuit board through a wave of flux dissolved in a solvent; in the heating station, initially simultaneously subjecting the fluxed printed circuit board to radiant heating and convection heating by a forced flow of heated gaseous medium, to evaporate the solvent and sweep the vapors from the printed circuit board, and then subjecting the printed circuit board solely to a source of more intense radiant heat to complete evaporation of the solvent and to preheat the fluxed surfaces of the printed circuit board; and, in the soldering station, passing the fluxed printed circuit board through a wave of molten solder to apply molten solder to the heated fluxed surfaces of the printed circuit board.

10. A method of progressively fluxing and soldering a printed circuit board comprising the steps of moving the printed circuit board along a path including, in succession, a fluxing station, a heating station and a soldering station; in the fluxing station, passing the printed circuit board through a wave of flux dissolved in solvent; in the heating station, initially simultaneously subjecting the fluxed printed circuit board to black infra-red radiant heating and convection heating by a forced flow of heated gaseous medium, to evaporate the solvent and sweep the vapors from the printed circuit board, and then subjecting the printed circuit board solely to a source of more intense infra-red radiant heat to complete evaporation of the solvent and to heat the fluxed surfaces of the printed circuit board; and, in the soldering station, passing the printed circuit board through a wave of molten solder to apply molten solder to the heated fluxed surfaces of the printed circuit board.

11. Apparatus for progressively fluxing and soldering a printed circuit board comprising, in combination, a fluxing station, a heating station and a soldering station arranged in succession along a path of travel for printed circuit boards; means at said fluxing station forming a wave of flux dissolved in a solvent and extending transversely of said path; simultaneously operable heating means including convection heating means, providing a forced flow of heated gaseous medium, combined with radiant heating means at said heating station conjointly operable to evaporate solvent from fluxed surfaces of a printed circuit board and sweep the vapors away; means at said soldering station forming a wave of molten solder extending transversely of said path; and means operable to transport a printed circuit board along said path through said flux wave, said heating station and said soldering wave.

12. Apparatus for progressively fluxing and soldering a printed circuit board comprising, in combination, a fluxing station, a heating station and a soldering station arranged in succession along a path of travel for printed circuit boards; means at said fluxing station forming a wave of flux dissolved in a solvent and extending transversely of said path; simultaneously operable heating means including convection heating means, providing a forced flow of heated gaseous medium, combined with radiant heating means at said heating station conjointly operable to evaporate solvent from fluxed surfaces of a printed circuit board and sweep the vapors away; means at said soldering station forming a wave of molten solder extending transversely of said path; means operable to transport a printed circuit board along said path through said flux wave, said heating station and said soldering wave; and means at each of said fluxing and soldering stations selectively and individually operable to adjust the depth of immersion of a printed circuit board relative to the wave at the respective station.

13. Apparatus for progressively fluxing and soldering a printed circuit board comprising, in combination, a fluxing station, a heating station and a soldering station arranged in succession along relatively elongated guide rail means defining a path of travel for printed circuit boards; means at said fluxing station forming a wave of flux dissolved in a solvent and extending transversely of said path; simultaneously operable heating means including convection heating means, providing a forced flow of heated gaseous medium, combined with radiant heating means at said heating station conjointly operable to evaporate solvent from fluxed surfaces of a printed circuit board and sweep the vapors away; means at said soldering station forming a wave of molten solder extending transversely of said path; means operable to transport a printed circuit board along said guide rail means through said flux wave, said heating station and said soldering wave; said guide rail means including successive guide rail sections, at each of said stations, adjustable as to angle of inclination; and means selectively operable and independently operable to adjust said guide rail sections to adjust the vertical angles of entry and exit of printed circuit boards into and from the waves at said fluxing station and said soldering station.

14. Apparatus for progressively fluxing and soldering a printed circuit board comprising, in combination, a fluxing station, a heating station and a soldering station arranged in succession along relatively elongated guide rail means defining a path of travel for printed circuit boards; means at said fluxing station forming a wave of flux dissolved in a solvent and extending transversely of said path; simultaneously operable heating means including convection heating means, providing a forced flow of heated gaseous medium, combined with radiant heating means at said heating station conjointly operable to evaporate solvent from fluxed surfaces of a printed circuit board and sweep the vapors away; means at said soldering station forming a wave of molten solder extending transversely of said path; means operable to transport a printed circuit board along said guide rail means through said flux wave, said heating station and said soldering wave; said guide rail means including successive guide rail sections, at each of said stations, adjustable as to height and angle of inclination; means at each of said fluxing and soldering stations selectively and individually operable to adjust said guide rail sections to adjust the depth of immersion of a printed circuit board relative to the wave at the respective station; and means selectively operable to adjust said guide rail sections and independently operable to adjust the vertical angles of entry and exit of the printed circuit boards into and from the waves at said fluxing station and at said soldering station.

15. Apparatus for progressively fluxing and soldering a printed circuit board comprising, in combination, a relatively elongated housing having a substantially horizontal upper surface; a fluxing station, a heating station and a soldering station arranged in succession within and longitudinally of said housing; means at said fluxing station forming a wave of flux dissolved in a solvent, and the wave extending transversely of said upper surface; simultaneously operable heating means including convection heating means, providing a forced flow of heated gaseous medium, combined with radiant heating means at said heating station conjointly operable to evaporate solvent from fluxed surfaces of a printed circuit board and to sweep the vapors away; means at said soldering station forming a wave of molten solder extending transversely of said upper surface; a pair of laterally spaced rails extending longitudinally above said upper surface; a carrier mounted for movement along said rails to carry a printed circuit board through said flux wave, past said heating station and through said solder wave; driving means adjacent said rails operable to move said carrier along said rails; said rails being divided into longitudinally successive sections each extending through a respective station; and individually operable respective height adjusting means disposed at the ends and junctions of said rail sections whereby said rail sections may be adjusted to control the depth of immersion of a printed circuit board in either of said waves, and to control the angles of exit and entry of a printed circuit board with respect to each of said waves.

16. Apparatus for progressively fluxing and soldering a printed circuit board comprising, in combination, a fluxing station, a heating station and a soldering station arranged in succession along a path of travel for printed circuit boards; means at said fluxing station forming a wave of flux dissolved in a solvent and extending transversely of said path; convection and radiant heating means at said heating station conjointly operable to evaporate solvent from fluxed surfaces of a printed circuit board and sweep the vapors away; means at said soldering station forming a wave of molten solder extending transversely of said path; and means operable to transport a printed circuit board along said path through said flux wave, said heating station and said soldering wave; said radiant heating means comprising a substantially horizontal and relatively elongated black infra-red heating plate; said convection heating means comprising plural laterally spaced slots extending longitudinally of said plate, and means for delivering heated air upwardly through said slots.

17. Apparatus for progressively fluxing and soldering a printed circuit board comprising, in combination, a fluxing station, a heating station and a soldering station arranged in succession along a path of travel for printed circuit boards; means at said fluxing station forming a wave of flux dissolved in a solvent and extending transversely of said path; simultaneously operable heating means including convection heating means, providing a forced flow of heated gaseous medium, combined with radiant heating means at said heating station conjointly operable to evaporate solvent from fluxed surfaces of a printed circuit board and sweep the vapors away; means at said soldering station forming a wave of molten solder extending transversely of said path; and means operable to transport a printed circuit board along said path through said flux wave, said heating station and said soldering wave; said convection and radiant heating means including a relatively flat and substantially horizontal plate extending longitudinally of said path and forming a source of black infra-red energy.

18. Apparatus for progressively fluxing and soldering a printed circuit board, as claimed in claim 11, in which said convection and radiant heating means comprises a first substantially flat and horizontal metal plate extending longitudinally of said path; means for heating said plate to a first predetermined temperature to constitute a source of black infra-red energy; plural laterally spaced slots extending longitudinally of said first plate; means for delivering heated air upwardly through said slots; a second substantially flat and horizontal plate downstream along said path from said first plate; and means for heating said second plate to a second and higher temperature to constitute a high intensity source of infra-red energy.

19. Apparatus for progressively fluxing and soldering a printed circuit board, as claimed in claim 11, in which said flux and solder waves are double-sided standing waves.

References Cited

UNITED STATES PATENTS

| | | | |
|---|---|---|---|
| 3,039,185 | 6/1962 | Oates | 29—503 |
| 3,092,059 | 6/1963 | Tesch | 228—37 |
| 3,100,471 | 8/1963 | Guthier | 228—37 |
| 3,112,723 | 12/1963 | Potocki | 29—495 X |
| 3,122,117 | 2/1964 | Marzullo et al. | 29—495 X |
| 3,218,193 | 11/1965 | Isaacson | 228—37 |

JOHN F. CAMPBELL, *Primary Examiner.*

J. CLINE, *Assistant Examiner.*